United States Patent
Behringer et al.

(10) Patent No.: US 12,046,696 B2
(45) Date of Patent: Jul. 23, 2024

(54) OPTOELECTRONIC SEMICONDUCTOR COMPONENT AND METHOD FOR PRODUCING THE SAME

(71) Applicant: OSRAM Opto Semiconductors GmbH, Regensburg (DE)

(72) Inventors: Martin Behringer, Regensburg (DE); Alexander Tonkikh, Wenzenbach (DE); Tansen Varghese, Regensburg (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 235 days.

(21) Appl. No.: 17/415,003

(22) PCT Filed: Dec. 18, 2019

(86) PCT No.: PCT/EP2019/085866
§ 371 (c)(1),
(2) Date: Jun. 17, 2021

(87) PCT Pub. No.: WO2020/127435
PCT Pub. Date: Jun. 25, 2020

(65) Prior Publication Data
US 2022/0069160 A1 Mar. 3, 2022

(30) Foreign Application Priority Data
Dec. 20, 2018 (DE) ...................... 10 2018 133 123.1

(51) Int. Cl.
*H01L 33/00* (2010.01)
*H01L 33/06* (2010.01)
(Continued)

(52) U.S. Cl.
CPC .......... *H01L 33/06* (2013.01); *H01L 33/0093* (2020.05); *H01L 33/0095* (2013.01);
(Continued)

(58) Field of Classification Search
None
See application file for complete search history.

(56) References Cited

U.S. PATENT DOCUMENTS

| 2004/0124409 A1 | 7/2004 | Ebe et al. |
| 2006/0060833 A1 | 3/2006 | Bruckner et al. |

(Continued)

FOREIGN PATENT DOCUMENTS

| CN | 102122688 A | 7/2011 |
| CN | 102664223 A | 9/2012 |

(Continued)

OTHER PUBLICATIONS

International Search Report (with English translation) and Written Opinion mailed Mar. 10, 2020 for corresponding International Application No. PCT/EP2019/085866 13 pages.
(Continued)

*Primary Examiner* — Bradley Smith
(74) *Attorney, Agent, or Firm* — MH2 TECHNOLOGY LAW GROUP LLP

(57) ABSTRACT

An optoelectronic semiconductor device comprises an active zone comprising sub-layers for forming a quantum well structure. Differences in energy levels of the quantum well structure are smaller in a central region of the optoelectronic semiconductor device than in an edge region of the optoelectronic semiconductor device. According to further embodiments, an optoelectronic semiconductor device comprises an active zone comprising a sub-layer which is suitable for forming a quantum well structure. In the active zone, quantum dot structures are formed in a central region of the optoelectronic semiconductor device. No quantum dot structures are formed in an edge region of the optoelectronic semiconductor device.

17 Claims, 6 Drawing Sheets

(51) Int. Cl.
*H01L 33/24* (2010.01)
*B82Y 20/00* (2011.01)
*B82Y 40/00* (2011.01)
*H01L 25/075* (2006.01)

(52) U.S. Cl.
CPC .............. *H01L 33/24* (2013.01); *B82Y 20/00* (2013.01); *B82Y 40/00* (2013.01); *H01L 25/0753* (2013.01)

(56) References Cited

U.S. PATENT DOCUMENTS

| | | |
|---|---|---|
| 2007/0200135 A1 | 8/2007 | Wang |
| 2008/0073655 A1 | 3/2008 | Albrecht et al. |
| 2012/0280207 A1 | 11/2012 | Avramescu et al. |
| 2013/0092221 A1* | 4/2013 | De Moura Dias Mendes ............ H01L 31/075 136/255 |
| 2014/0057417 A1 | 2/2014 | Leirer et al. |
| 2016/0087150 A1* | 3/2016 | Ristic ...................... H01S 5/405 438/37 |
| 2017/0170360 A1 | 6/2017 | Bour et al. |
| 2018/0286927 A1* | 10/2018 | Xiao ...................... H10K 50/19 |
| 2019/0109246 A1 | 4/2019 | Hirai et al. |
| 2020/0105824 A1* | 4/2020 | Dimitropoulos .... H01L 33/0075 |
| 2020/0303898 A1 | 9/2020 | Stojetz et al. |

FOREIGN PATENT DOCUMENTS

| | | |
|---|---|---|
| CN | 108884973 A | 11/2018 |
| DE | 10 2006 043 400 A1 | 3/2008 |
| DE | 10 2013 104273 A1 | 10/2014 |
| DE | 10 2015 104700 A1 | 9/2016 |
| DE | 10 2011 012 925 A1 | 9/2021 |
| JP | 2004281954 A | 10/2004 |
| KR | 20170086237 A | 7/2017 |
| WO | 2020069467 A1 | 4/2020 |

OTHER PUBLICATIONS

Hangleiter, A. et al: "Suppression of nonradiative recombination by Vshaped pits in GaInN/GaN quantum wells produces a large increase in the light emission efficiency," Physical Review Letters, American Physical Society, US, Bd. 95, Nr. 12, Sep. 16, 2005, pp. 127402/1-127402/4.

Search report of Sep. 22, 2023 issued in corresponding Chinese patent application No. 201980085245.X, 6 pages.

* cited by examiner

OPTOELECTRONIC SEMICONDUCTOR COMPONENT AND METHOD FOR PRODUCING THE SAME

CROSS-REFERENCE TO RELATED APPLICATION

This patent application is a national stage entry from International Application No. PCT/EP2019/085866, filed on Dec. 18, 2019, published as International Publication No. WO 2020/127435 A1 on Jun. 25, 2020, and claims priority under 35 U.S.C. § 119 from German patent application 10 2018 133 123.1, filed Dec. 20, 2018, the entire contents of all of which are incorporated by reference herein.

BACKGROUND

In light emitting diodes (LEDs) dangling bonds occur at the edges of the mesas, which, for example, may lead to non-radiative recombination of charge carriers. Non-radiative re-combination may reduce the optical efficiency.

Therefore concepts are sought by means of which the problem of non-radiative recombination may be reduced.

The object of the present invention is to provide an improved optoelectronic semiconductor device and a method for manufacturing an optoelectronic semiconductor device.

According to embodiments, the object is achieved by the subject matter and the method of the independent patent claims. Advantageous enhancements are defined in the dependent claims.

SUMMARY

An optoelectronic semiconductor device comprises an active zone which includes sub-layers for forming a quantum well structure. In this case, differences in energy levels within the quantum well structure are smaller in a central region of the optoelectronic semiconductor device than in an edge region of the optoelectronic semiconductor device.

For example, the varying differences in energy levels may be caused by a thinner layer thickness of the sub-layers of the quantum well structure in the edge area compared to the central area.

According to further embodiments, an optoelectronic semiconductor device comprises an active zone including a sub-layer which is suitable for forming a quantum well structure. In this case, quantum-dot structures are formed in the active zone in a central region of the optoelectronic semiconductor device and quantum well structures are formed in an edge region of the optoelectronic semiconductor device.

For example, the sub-layer for forming the active zone has a smaller layer thickness in the edge area than in the central area.

For example, in the edge region, the sub-layers for forming the active zone may be formed along a direction which intersects a horizontal direction.

According to embodiments, the optoelectronic semiconductor device further comprises a first semiconductor layer of a first conductivity type and a second semiconductor layer of a second conductivity type. In this case, the active zone is disposed between the first and the second semiconductor layer.

The optoelectronic semiconductor device may be a light-emitting diode, for example. On the other hand, the optoelectronic semiconductor device may also be a converter which is suitable for receiving electromagnetic radiation of a first wavelength and for emitting electromagnetic radiation of a second wavelength that is greater than the first wavelength.

For example, sidewalls of the optoelectronic semiconductor device may intersect a horizontal direction.

According to further embodiments, the sub-layers of the active zone may be arranged over a trapezoidal substrate region.

A method for manufacturing an optoelectronic semiconductor device comprises patterning a first main surface of a growth substrate, so that the first main surface comprises horizontal regions and inclined flanks. The method further comprises epitaxially growing a semiconductor layer structure including sub-layers for producing an active zone comprising quantum well structures over the first main surface, so that the layer structure comprises a smaller layer thickness in the area of the inclined flanks than in the horizontal areas.

For example, growing the semiconductor layer structure may comprise growing a first semiconductor layer of a first conductivity type, the sub-layers for forming the active zone and a second semiconductor layer of a second conductivity type.

The layers for producing the active zone may be formed in an inclined manner in the area of the inclined flanks.

According to embodiments, the quantum well structures in the region of the inclined flanks may have greater energy differences in energy levels than the quantum well structures in the horizontal regions.

According to further embodiments, quantum dots may be formed in the horizontal areas and no quantum dots may be formed in the area of the inclined flanks.

The method may furthermore include singulating individual optoelectronic semiconductor devices in the region of the inclined flanks.

The method may furthermore comprise removing or thinning the growth substrate.

An optoelectronic apparatus may contain a plurality of optoelectronic semiconductor devices as described above. The optoelectronic apparatus may, for example, be a display device, a projector or a pixel array.

BRIEF DESCRIPTION OF THE DRAWINGS

The accompanying drawings serve to provide an understanding of exemplary embodiments of the invention. The drawings illustrate exemplary embodiments and, together with the description, serve for explanation thereof. Further exemplary embodiments and many of the intended advantages will become apparent directly from the following detailed description. The elements and structures shown in the drawings are not necessarily shown to scale relative to each other. Like reference numerals refer to like or corresponding elements and structures.

DETAILED DESCRIPTION

Figure 1A:
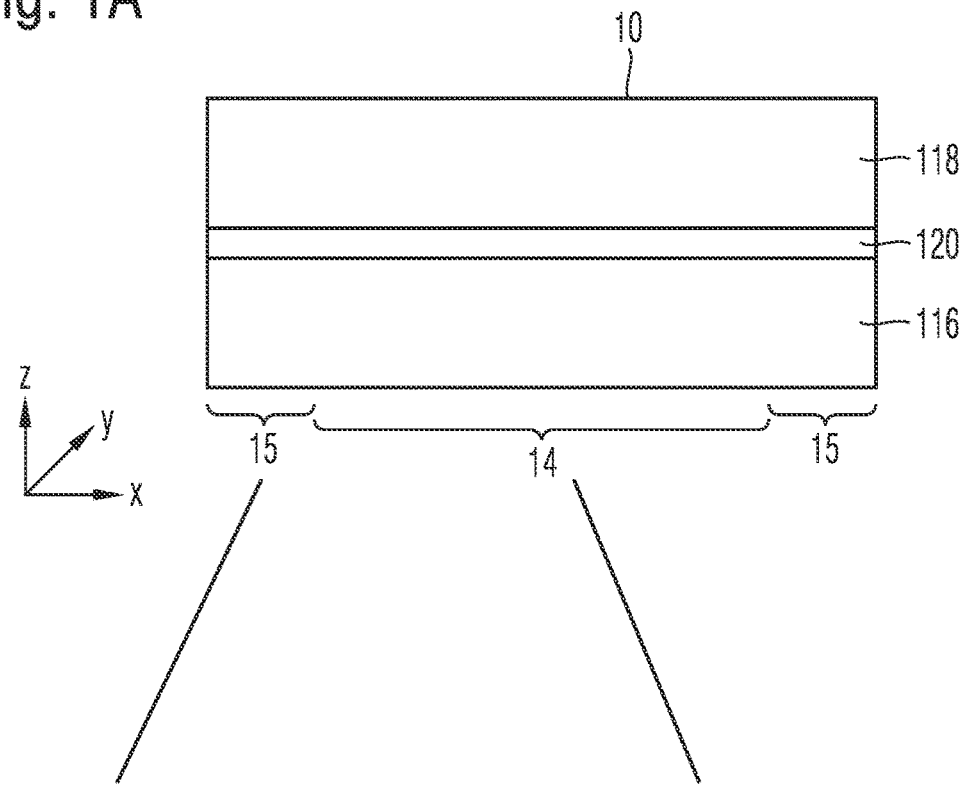
FIG. 1A shows a schematic cross-sectional view of an optoelectronic semiconductor device for the purpose of explaining features.

In the following detailed description, reference is made to the accompanying drawings, which form a part of the disclosure and in which specific exemplary embodiments are shown for purposes of illustration. In this context, directional terminology such as "top", "bottom", "front", "back", "over", "on", "in front", "behind", "leading", "trailing", etc. refers to the orientation of the figures just described. As the components of the exemplary embodiments may be positioned in different orientations, the directional terminology is used by way of explanation only and is in no way intended to be limiting.

The description of the exemplary embodiments is not limiting, since there are also other exemplary embodiments, and structural or logical changes may be made without departing from the scope as defined by the patent claims. In particular, elements of the exemplary embodiments described below may be combined with elements from others of the exemplary embodiments described, unless the context indicates otherwise.

The terms "wafer" or "semiconductor substrate" used in the following description may include any semiconductor-based structure that has a semiconductor surface. Wafer and structure are to be understood to include doped and undoped semiconductors, epitaxial semiconductor layers, supported by a base, if applicable, and further semiconductor structures. For example, a layer of a first semiconductor material may be grown on a growth substrate made of a second semiconductor material or of an insulating material, for example sapphire. Further examples of materials for growth substrates include glass, silicon dioxide, quartz or a ceramic.

Depending on the intended use, the semiconductor may be based on a direct or an indirect semiconductor material. Examples of semiconductor materials particularly suitable for generating electromagnetic radiation include, without limitation, nitride semiconductor compounds, by means of which, for example, ultraviolet, blue or longer-wave light may be generated, such as GaN, InGaN, AlN, AlGaN, AlGaInN, AlGaInBN, phosphide semiconductor compounds by means of which, for example, green or longer-wave light may be generated, such as GaAsP, AlGaInP, GaP, AlGaP, and other semiconductor materials such as GaAs, AlGaAs, InGaAs, AlInGaAs, SiC, ZnSe, ZnO, $Ga_2O_3$, diamond, hexagonal BN and combinations of the materials mentioned. The stoichiometric ratio of the ternary compounds may vary. Other examples of semiconductor materials may include silicon, silicon germanium, and germanium. In the context of the present description, the term "semiconductor" also includes organic semiconductor materials.

The term "substrate" generally includes insulating, conductive or semiconductor substrates.

The terms "lateral" and "horizontal", as used in the present description, are intended to describe an orientation or alignment which extends essentially parallel to a first surface of a semiconductor substrate or semiconductor body. This may be the surface of a wafer or a chip (die), for example.

The horizontal direction may, for example, be in a plane perpendicular to a direction of growth when layers are grown. For example, the horizontal direction is parallel to a substrate surface.

The term "vertical", as used in this description, is intended to describe an orientation which is essentially perpendicular to the first surface of a substrate or semiconductor body. The vertical direction may correspond, for example, to a direction of growth when layers are grown.

In the context of this description, the term "electrically connected" means a low-ohmic electrical connection between the connected elements. The electrically connected elements need not necessarily be directly connected to one another. Further elements may be arranged between electrically connected elements.

The term "electrically connected" also encompasses tunnel contacts between the connected elements.

To the extent used herein, the terms "have", "include", "comprise", and the like are open-ended terms that indicate the presence of said elements or features, but do not exclude the presence of further elements or features. The indefinite articles and the definite articles include both the plural and the singular, unless the context clearly indicates otherwise.

FIG. 1A shows a schematic cross-sectional view of an optoelectronic semiconductor device 10 in an x-z plane. Here, z indicates a growth direction of the semiconductor layers. The optoelectronic semiconductor device 10 may be a light-emitting diode, for example. However, according to further embodiments, it may also be another optoelectronic semiconductor device, for example a detector for detecting incident electromagnetic radiation or the like. The optoelectronic semiconductor device comprises a first semiconductor layer 116 of a first conductivity type, an active zone 120 comprising quantum well structures, and a second semiconductor layer 118 of a second conductivity type.

Figure 1B:
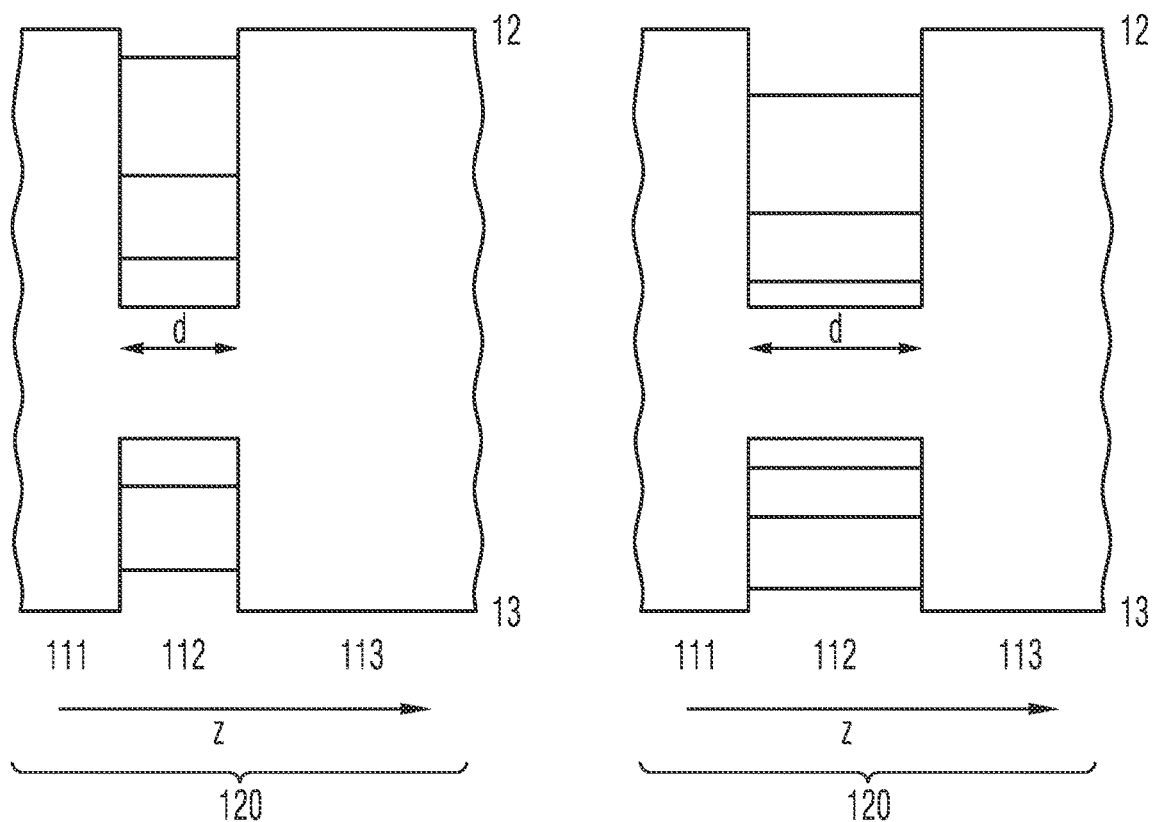
FIG. 1B schematically illustrates energy levels of a quantum well structure.

For a more detailed explanation, FIG. 1B shows energy levels within the quantum well structure, which may be produced, for example, when sub-layers 111, 112, 113 are grown over one another in the z-direction to form the active zone.

The sub-layers 111 and 113 each have a larger band gap than the band gap of the sub-layer 112, which is arranged between the sub-layers 111 and 113. For example, a layer thickness of the second sub-layer 112 is smaller than the de Broglie wavelength of the electrons in the semiconductor material. For example, the conduction band 12 and the valence band 13 in the sub-layers 111, 112, 113 are of the pattern shown in FIG. 1B. At a correspondingly small thickness d of the second sub-layer 112, energy levels are formed both in the conduction band 12 and in the valence band 13. The position of the energy levels depends on the width d of the second sub-layer 112.

The left-hand part of FIG. 1B shows the energy levels in an edge region 15, the right-hand part of FIG. 1B shows the energy levels in a central part 14. Differences in energy levels within the quantum well structure are smaller in a central region 14 of the optoelectronic semiconductor device 10 than in an edge region 15 of the optoelectronic semiconductor device. Due to the feature that differences in energy levels within the quantum well structures are smaller in a central area than in an edge area of the optoelectronic semiconductor device, the conduction band 12 comprises an energy minimum in the central area 14, while the energy of electrons of the conduction band increases towards the edge 15 of the device. In a corresponding manner, the valence band 13 has its maximum in the central region 14, while dropping off towards the edge region 15 of the device. As a result, the charge carriers in each case diffuse away from the edge region 15 into the central region 14 of the optoelectronic semiconductor device 10. As a further result, much of the recombination of electrons and holes takes place in the central region 14, while recombination in the edge region 15 is reduced. As a result, less non-radiative recombination takes place within the optoelectronic semiconductor device 10. As a result, the emission efficiency of the optoelectronic semiconductor device may be increased.

Correspondingly, varying differences in energy levels may be effected, for example, by adjusting the layer thickness of layers of the quantum well structure in the edge region 15, in comparison to the central region 14. By making particularly the sub-layer 112, where the quantized energy levels are present, thinner in the edge area 15 than in the central area 14, the pattern of the conduction and valence bands 12, 13 depicted in FIG. 1A may be achieved.

According to further embodiments, the band gap in the edge region 15 may also be enlarged by means of specifically introduced strain. For example, depending on the material used, tensile strain may be introduced in the sub-layer 112 in the edge region 15, as a result of which the band gap may be enlarged.

Figure 1C:
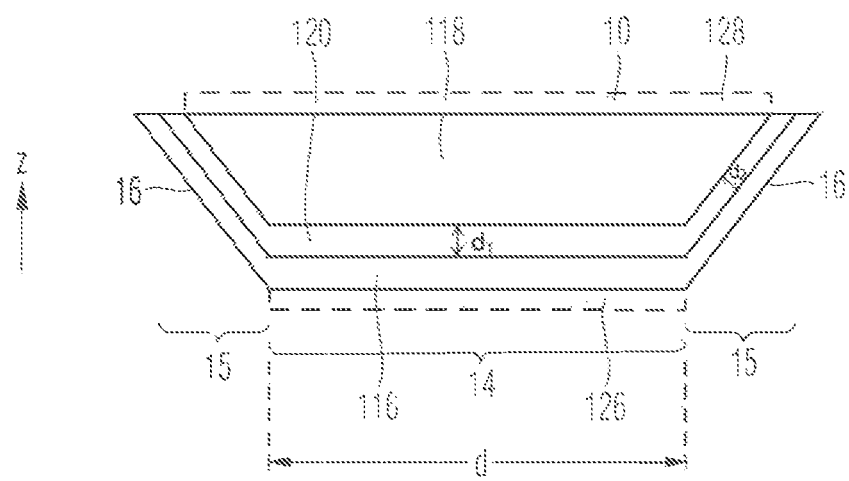
FIG. 1C shows a schematic cross-sectional view of an optoelectronic semiconductor device according to embodiments.

FIG. 1C shows a cross-sectional view of an optoelectronic semiconductor device 10 according to embodiments. For example, the optoelectronic semiconductor device 10 may comprise a first semiconductor layer 116 of a first conductivity type, for example p-type, and a second semiconductor layer 118 of a second conductivity type, for example n-type. An active zone 120 is arranged between the semiconductor layer 116 and the second semiconductor layer 118. The active zone 120 may, for example, comprise a second sub-layer 112, which is arranged between a first and third sub-layer 111 and 113, each with a larger band gap. For example, the sub-layers 111, 112, 113 may include InGaAlP, InGaAs or ZnSe.

The active zone described in the context of the present invention may, for example, comprise a single quantum well structure (SQW, single quantum well) for generating radiation. The term "quantum well structure" does not imply any particular meaning here with regard to the dimensionality of the quantization. Therefore it includes, among other things, quantum wells, quantum wires and quantum dots as well as any combination of these layers.

According to the invention, it is provided that at least the second sub-layer 112 has a greater layer thickness $d_1$ in a central region 14 of the optoelectronic semiconductor device than in an edge region 15 (thickness $d_2$) of the optoelectronic semiconductor device.

As will be described later with reference to FIGS. 2A to 2D and 3A to 3D, this may be achieved by forming the optoelectronic semiconductor device 10 with inclined sidewalls. In this case, the first semiconductor layer 116 and the second semiconductor layer 118 as well as the sub-layers 111, 112, 113 of the active zone 120 may each be formed to conform to a structure of the substrate material. That is, the respective layers are each formed as horizontal layers on horizontal regions of the substrate material. Furthermore, they are each formed as inclined layers in the region of inclined flanks of the substrate material. The crystal layers of the semiconductor layers in the edge region 15 of the optoelectronic semiconductor device 10 each follow the inclined sidewall 16 of the optoelectronic semiconductor device. Surfaces of the semiconductor and sub-layers each extend along a direction which intersects a horizontal direction.

The optoelectronic semiconductor device 10 may, for example, be formed at least partially in an trapezoidal manner. For example, a horizontal dimension d or width in the z direction may increase or decrease.

Figure 1D:
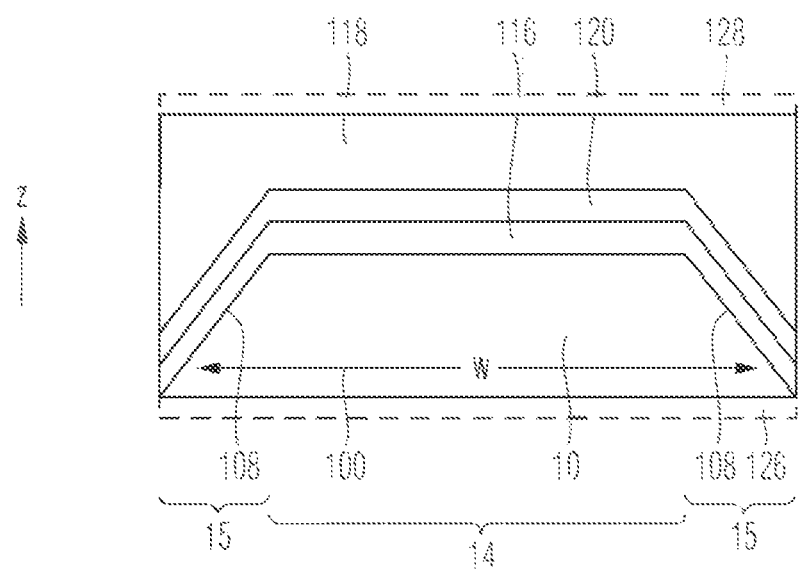
FIG. 1D shows a schematic cross-sectional view of an optoelectronic semiconductor device according to further embodiments.

FIG. 1D shows a cross-sectional view of an optoelectronic semiconductor device 10 according to further embodiments. The optoelectronic semiconductor device 10 is formed over part of a growth substrate 100. The growth substrate may, for example, be a GaAs substrate. Further examples of a growth substrate include InP, GaSb, InAs, sapphire, SiC, GaN, GaP, Si or Ge. The growth substrate 100 comprises inclined side flanks 108. That is, the growth substrate 100 is formed in a trapezoidal manner in places. A horizontal dimension w of the substrate may increase or decrease along the z direction. The first semiconductor layer 116, the second semiconductor layer 118 and the sub-layers of the active zone 120 lying between the first semiconductor layer 116 and the second semiconductor layer 118 are each formed in a conformal manner over the patterned substrate area. That is, in the region of the growth substrate 100 with a horizontal surface, the layers 116, 118 and the sub-layers of the active zone 120 are formed as horizontal layers. In the region of the inclined flanks 108 of the growth substrate 100, these layers are also formed as inclined layers. Surfaces of the semiconductor layers or sub-layers may each extend along a direction which intersects a horizontal direction.

The optoelectronic semiconductor device 10 may additionally include part of a substrate, which may be the growth substrate 100, for example.

According to embodiments, the optoelectronic semiconductor device 10 shown in FIGS. 1C and 1D may be a light-emitting diode and may emit electromagnetic radiation by applying a suitable voltage. The optoelectronic semiconductor device 10 may comprise a first contact layer 126, which is electrically connected to the first semiconductor layer 116. In addition, the optoelectronic semiconductor device 10 may comprise a second contact layer 128, which is electrically connected to the second semiconductor layer 118. By applying a voltage between the first and second contact layers 126, 128, for example, emission of electromagnetic radiation may be effected.

According to further embodiments, the electrical contact layers may be omitted in the optoelectronic semiconductor device 10 shown in FIGS. 1C and 1D. In this case, the optoelectronic semiconductor device may represent a converter which may emit electromagnetic radiation by absorbing electromagnetic radiation. For example, the first semiconductor layer 116 and the second semiconductor layer 118 may each be undoped in this case.

As discussed below with reference to FIGS. 2A to 2D and 3A to 3D, the layer thicknesses of the conformally deposited layer thicknesses decrease in the area of the inclined sidewall 16 or the inclined flank 108. In this way it is possible to form the sub-layer 112 formed for producing the quantum well structure with a smaller thickness in an edge region 15 than in a central region. As a result, a greater energy difference between the conduction and valence bands 12, 13 than in the central area is effected in the edge area.

The optoelectronic semiconductor devices have a surface area of 1 to 2500 $\mu m^2$, for example. A dimension of a side surface may, for example, be 1 to 50 μm, for example 5 to 20 μm, for example approximately 10 μm. The edge area may each have a respective dimension of 0.1 to 3 μm.

Below methods for manufacturing the optoelectronic semiconductor device according to embodiments will be described.

Figure 2A:
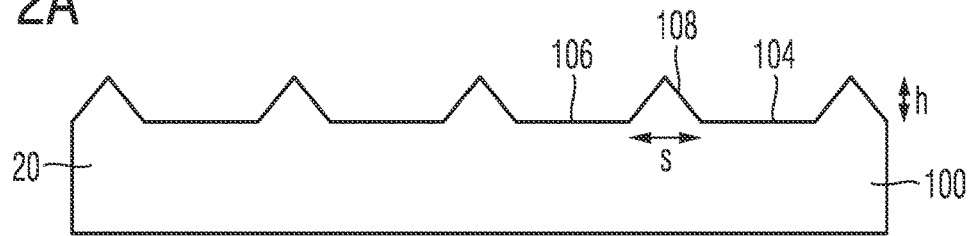
FIGS. 2A to 2D illustrate a cross-sectional view of a workpiece during manufacture of an optoelectronic semiconductor device according to embodiments.

A first main surface 104 of a growth substrate 100 is patterned, so that, as a result, the first main surface comprises horizontal regions 106 and inclined flanks 108. For example, as shown in FIG. 2A, the inclined flanks 108 may be implemented as regions protruding from the horizontal regions 106. For example, the protruding regions have a base width s and a height h. The horizontal surface regions are each embodied to be smooth, so that they are suitable for high-quality growth.

Figure 2B:
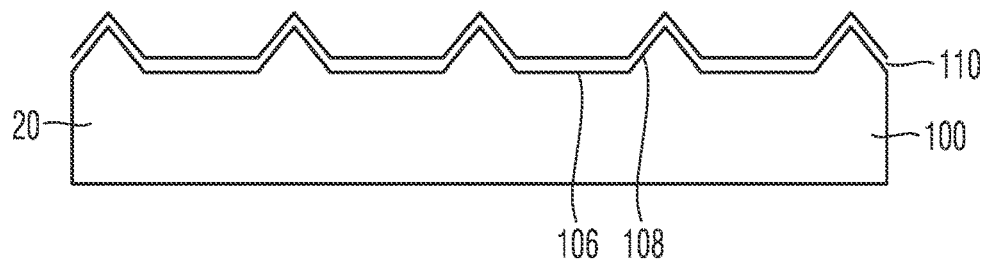

Then, as shown in FIG. 2B, a semiconductor layer structure 110 is grown epitaxially. The semiconductor layer structure 110 may, for example, comprise the first semiconductor layer 116, the second semiconductor layer 118 and sub-layers for producing an active zone 120 (each shown in FIG. 2C). The semiconductor layer structure 110 is grown over the first main surface 104, so that the individual crystal layers each follow the underlying material. As a result, the semiconductor layer structure has a smaller layer thickness in the region of the inclined flanks 108 than in the horizontal regions 106.

The smaller layer thickness may be achieved, for example, by expanding the surface of the first main surface 104 as a result of the presence of the inclined flanks 108. More precisely, a surface area in the region of the inclined flanks 108 is larger than the horizontal dimension s of the inclined flanks 108. As a consequence, given a uniform surface coverage of the growing species, the grown layer is grown with a smaller layer thickness.

The epitaxial growth may occur, for example, by molecular beam epitaxy (MBE). Here, inclined flanks receive less material. For example, the direction of the horizontal areas may correspond to the 001 direction. According to further embodiments, the semiconductor layer structure may be grown by another epitaxial method, for example by MOVPE (metal organic vapor phase epitaxy). Here, the horizontal regions may have a direction deviating from the 001 direction, for example the 111 direction. In the case of MOVPE processes or growth with high diffusion rates on the surface, the 111 surface is best suited for growth. All other directions then present on the inclined flanks show a lower growth rate and thus thinner layers.

For example, the sub-layers for producing the semiconductor layer structure 110 may contain InGaAlP or InGaAs.

Another reason for the thinner layer thickness in the region of the inclined flanks may be different stress ratios in this region compared to horizontal regions.

FIG. 2B shows a schematic cross-sectional view of the workpiece 20 in which the semiconductor layer structure 110 has grown over the growth substrate 100. As indicated schematically, a layer thickness of the semiconductor layer structure 110 is smaller in the region of the inclined flanks than in the horizontal regions.

Figure 2C:
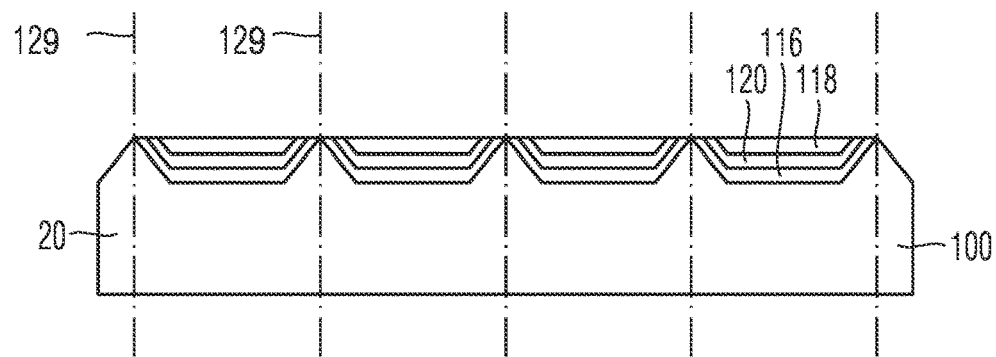

FIG. 2C shows a cross-sectional view of the workpiece 20. Starting from the growth substrate 100 shown in FIG. FIG. 2A, a first semiconductor layer 116 of a first conductivity type, for example p-type, a layer structure for producing the active zone 120, and a second semiconductor layer 118 of a second conductivity type, for example n-type, are applied over the structured surface 104 of the growth substrate 100. After a planarization step, the growth substrate 100 may be (at least partially) removed from the grown semiconductor layers.

Figure 2D:
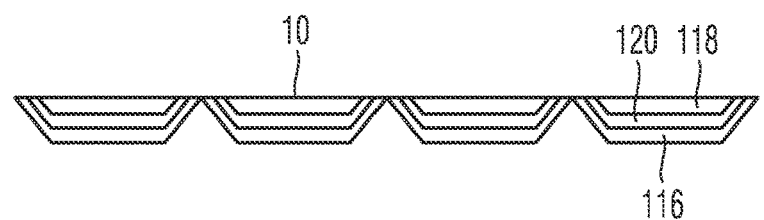

FIG. 2D shows a plurality of optoelectronic semiconductor devices 10 after removal of the growth substrate. Furthermore, the individual optoelectronic semiconductor devices 10 may be singulated along the separating lines 129, which are shown, for example, in FIG. 2C. This singulation may take place before or after the growth substrate 100 has been removed.

The separating lines 129 shown in FIG. 2C are arranged in the region of the inclined flank 108, so that the inclined flank is in each case arranged in an edge region 15 of the resulting optoelectronic semiconductor device 10.

Figure 3A:
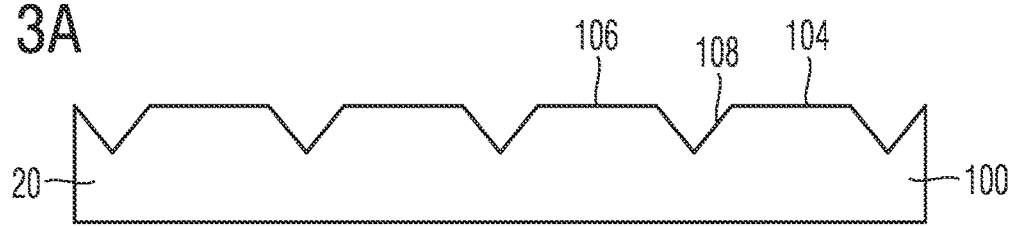
FIGS. 3A to 3D illustrate cross-sectional views of a workpiece during manufacture of an optoelectronic semiconductor device according to further embodiments.

FIGS. 3A to 3D illustrate the case in which the inclined flanks 108 are each formed as notches in the growth substrate. That is, the inclined flanks 108 do not protrude from the first main surface 104 of the growth substrate, but are instead embedded in the growth substrate 100. FIG. 3A shows a cross-sectional view of a workpiece 20 in which a plurality of inclined flanks 108 are each formed as notches in the growth substrate 100.

Figure 3B:
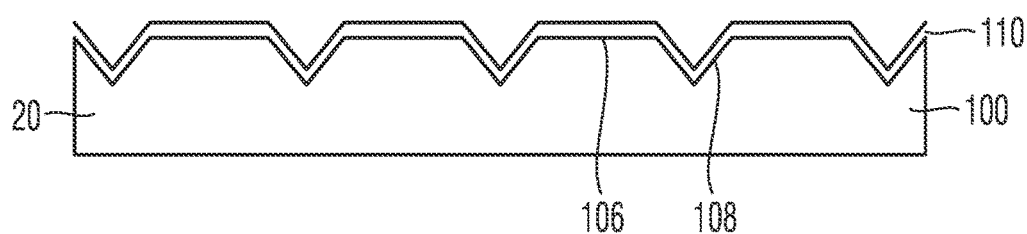

FIG. 3B shows a cross-sectional view of the workpiece 20 after the semiconductor layer structure 110 has been applied. In analogy to the workpiece 20 shown in FIG. 2B, a layer thickness of the semiconductor layer structure 110 is again thicker in the region of the horizontal surface regions 106 than in a region of the inclined flanks 108. As a result, the second sub-layer 112 is formed on the inclined flanks 108 with a smaller layer thickness, as described with reference to FIG. 2B.

Figure 3C:
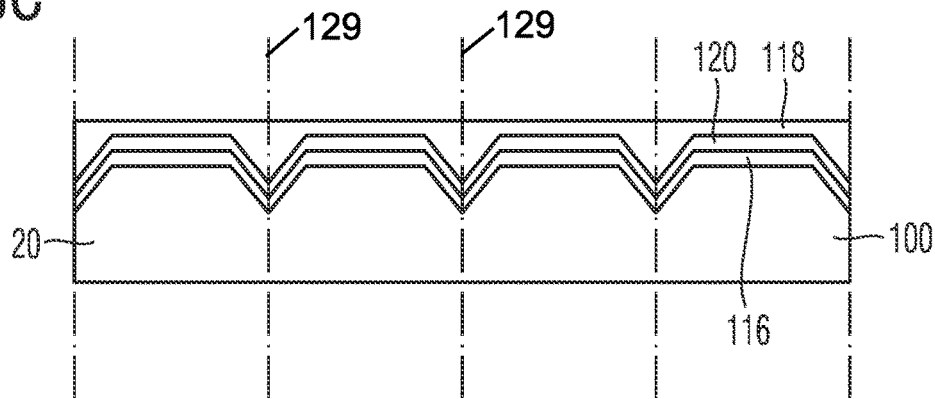

FIG. 3C shows a schematic cross-sectional view of the workpiece 20. A first semiconductor layer 116 of a first conductivity type, a layer structure for forming an active zone 120, and a second semiconductor layer 118 of a second conductivity type are grown over the growth substrate 100 shown in FIG. 3A. Here, too, the layers for forming the active zone 120, in particular, are each formed to be thinner in a region of the flanks 108 than in a region with a horizontal surface. In addition, a planarization step may be carried out. For example, the growth substrate 100 is additionally ground back from the workpiece 20 shown in FIG. 3C.

Figure 3D:
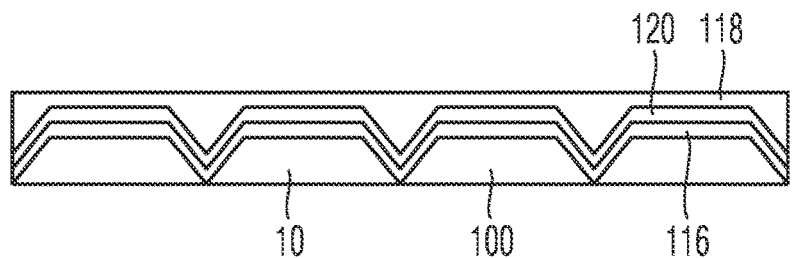

FIG. 3D shows an example of a resulting workpiece. Furthermore, the individual optoelectronic semiconductor devices may be singulated along the separating lines 129. The separating lines 129 shown in FIG. 3C are arranged in the region of the inclined flank 108, so that the inclined flank is in each case arranged in an edge region 15 of the resulting optoelectronic semiconductor device 10.

Another variant of the method is described below with reference to FIGS. 4A and 4B. In the process described in FIGS. 2B and 3B for depositing the semiconductor layer structure 110, the semiconductor layer structure 110 may comprise a sublayer that is deposited with a layer thickness such that quantum dots 122 are formed over the horizontal surface regions 106, while layer regions 124 are formed in the region of the inclined flanks 108. For example, the corresponding sub-layer of the semiconductor layer structure 110 may comprise indium arsenide. At a layer thickness of the indium arsenide layer in a range from 1.5 to 2.5 atomic layers, individual quantum dots 122 may form. If the layer thickness is less than 1.0 atomic layers, a stable layer is formed.

At an appropriately set dimensioning of the layer thickness of the associated sub-layer, the indium arsenide layer will be deposited with a greater layer thickness in the area of the horizontal surface areas 106. Accordingly, quantum dots 122 are formed here. A layer region 124 having a smaller layer thickness will each be formed in the region of the inclined flanks 108. This layer-thickness-selective formation of quantum dots is known as the S-K (Stranski- Krastanov) method. For example, the semiconductor layer structure 110 may contain further suitable sub-layers. When forming quantum dots 122 over horizontal surface regions 106, the effective conduction band may in each case be caused to have a minimum in a central region 12 of the resulting semiconductor device and to have a maximum in an edge region 15 of the semiconductor device.

In addition, the mechanical stress conditions prevailing at the inclined flanks 108 may differ from those in the horizontal regions 106. This may also influence the formation of quantum dots, for example. As a result, layers having a larger band gap may be produced at the inclined flanks 108.

Figure 4A:
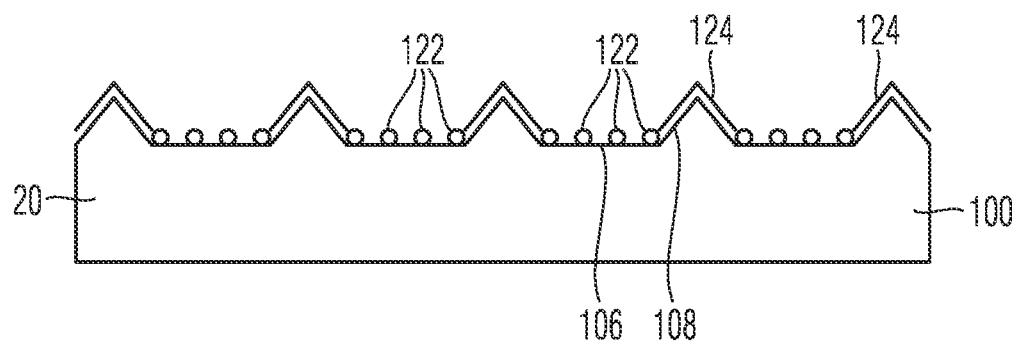
FIGS. 4A and 4B each illustrate workpieces for forming o an optoelectronic semiconductor device according to further embodiments.

FIG. 4A shows a schematic cross-sectional view of regions of an optoelectronic semiconductor device which is formed starting from the growth substrate 100 shown in FIG. 2A.

Figure 4B:
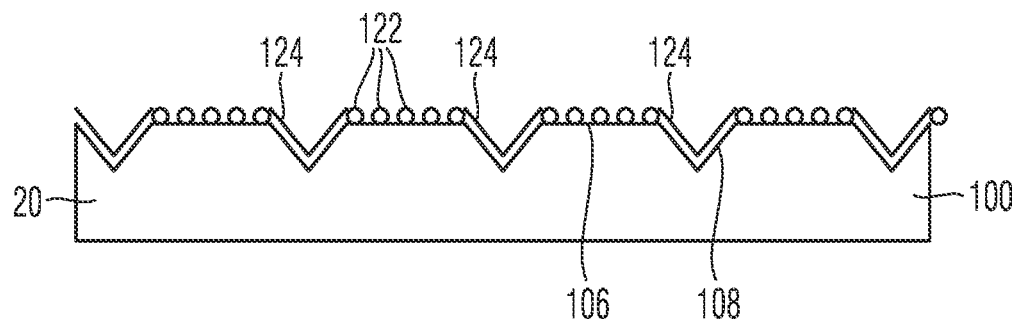

FIG. 4B shows a schematic cross-sectional view of regions of an optoelectronic semiconductor device which is formed starting from the growth substrate 100 shown in FIG. 3A.

According to embodiments, the optoelectronic device 10 described herein may be a device that is connected to corresponding electrical connections, for example, and is electrically pumpable via these connections. As a result, electromagnetic radiation may be emitted. According to further embodiments, the optoelectronic semiconductor device 10 may also be a converter structure. In this case, the optoelectronic device optionally comprises a first semiconductor layer which may be undoped or of a first conductivity type. The optoelectronic semiconductor device furthermore optionally comprise a second semiconductor layer which may be undoped or of a second conductivity type, and an active zone in between. Unlike a light emitting diode, however, the converter element is not electrically connected. For example, the converter element may be optically pumped. By irradiating electromagnetic radiation of a first wavelength, electromagnetic radiation of a second wavelength which is greater than the first wavelength may be emitted.

Figure 5:
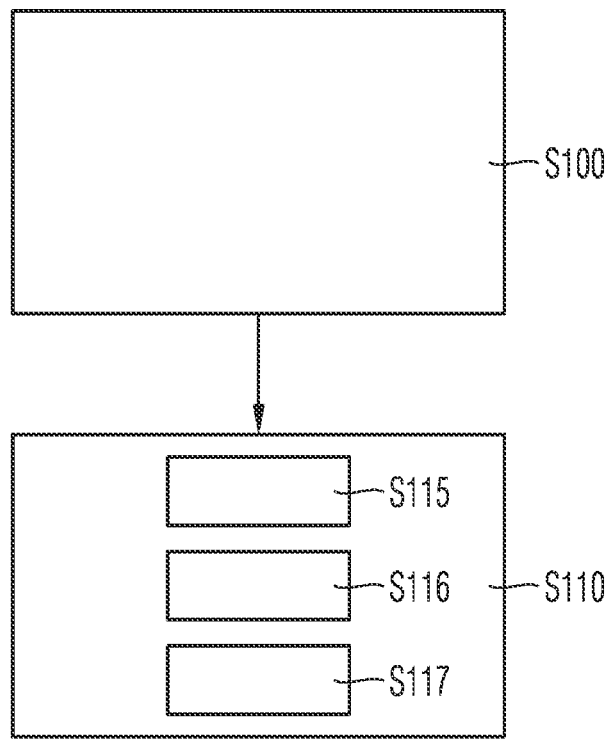
FIG. 5 outlines a method according to embodiments.

FIG. 5 outlines a method according to embodiments.

According to embodiments, a method for manufacturing an optoelectronic semiconductor device comprises patterning (S100) a first main surface of a growth substrate, so that the first main surface comprises horizontal regions and inclined flanks. The method further comprises epitaxially growing (S110) a semiconductor layer structure including layers for producing an active zone comprising quantum well structures over the first main surface. As a result, the layer structure comprises a smaller layer thickness in the area of the inclined flanks than in the horizontal areas. For example, growing the semiconductor layer structure (S110) may comprise growing (S115) a first semiconductor layer of a first conductivity type, growing (S116) the sub-layers to produce the active zone, and growing (S117) a second semiconductor layer of a second conductivity type.

Figure 6:
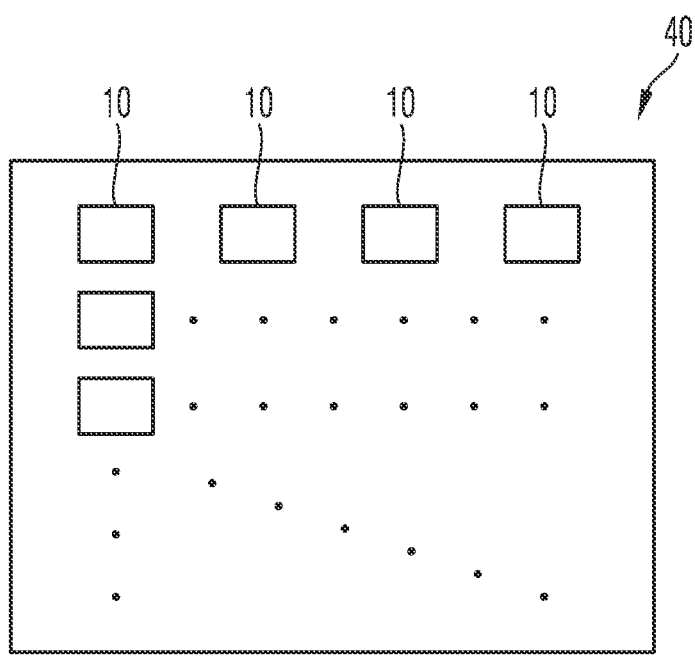
FIG. 6 shows a schematic view of an optoelectronic apparatus according to embodiments.

FIG. 6 shows an optoelectronic apparatus 30 according to embodiments. The optoelectronic apparatus 30 comprises a plurality of optoelectronic semiconductor devices 10 as described herein. The optoelectronic apparatus may be a video wall, a projector, a display apparatus or a pixel array, for example. The individual optoelectronic semiconductor devices 10 may, for example, be arranged in rows and columns. However, they may also be arranged in any other way. Also, the optoelectronic semiconductor devices may each have different sizes.

As has been described above, the specific configuration of the optoelectronic semiconductor device or the specific method allows non-radiative recombination in an edge region 15 of the optoelectronic semiconductor device 10 to be reduced. As a result, the optical efficiency may be increased.

Although specific embodiments have been illustrated and described herein, those skilled in the art will recognize that the specific embodiments shown and described may be replaced by a multiplicity of alternative and/or equivalent configurations without departing from the scope of the invention. The application is intended to cover any adaptations or variations of the specific embodiments discussed herein. Therefore, the invention is to be limited by the claims and their equivalents only.

The invention claimed is:

1. An optoelectronic semiconductor device comprising:
   a growth substrate, a first main surface of which comprises a horizontal region and inclined flanks, the horizontal region forming a central region and the inclined flanks forming an edge region of the optoelectronic semiconductor device, the inclined flanks adjoining a boundary of the optoelectronic semiconductor device; and
   a semiconductor layer structure which includes sub-layers for forming an active zone comprising quantum well structures over the first main surface, wherein the layer structure has a smaller layer thickness in the region of the inclined flanks than in the horizontal region,
   wherein differences in energy levels within the quantum well structure of the optoelectronic semiconductor device are smaller in a central region than in an edge region of the optoelectronic semiconductor device.

2. The optoelectronic semiconductor device according to claim 1, wherein the sub-layers of the active zone are arranged over a trapezoidal substrate region.

3. The optoelectronic semiconductor device according to claim 1, which is a light-emitting diode.

4. The optoelectronic semiconductor device according to claim 1, which is a converter which is suitable for receiving electromagnetic radiation of a first wavelength and for emitting electromagnetic radiation of a second wavelength which is greater than the first wavelength.

5. The optoelectronic semiconductor device according to claim 1, further comprising
   a first semiconductor layer of a first conductivity type, and
   a second semiconductor layer of a second conductivity type, the active zone being arranged between the first and the second semiconductor layers.

6. An optoelectronic semiconductor device comprising:
   a growth substrate, a first main surface of which comprises a horizontal region and inclined flanks, the horizontal region forming a central region and the inclined flanks forming an edge region of the optoelectronic semiconductor device, the inclined flanks adjoining a boundary of the optoelectronic semiconductor device,
   an active zone comprising sub-layers for forming a quantum-dot structure,
   wherein, in the active zone, quantum dot structures are formed in a central area of the optoelectronic semiconductor device and no quantum dot structures are formed in the edge region of the opto-electronic semiconductor device.

7. The optoelectronic semiconductor device according to claim 6, wherein the sub-layers for forming the active zone have a smaller layer thickness in the edge region than in the central region.

8. The optoelectronic semiconductor device according to claim 6, wherein in the edge region, the sub-layers for forming the active zone are formed along a direction which intersects a horizontal direction.

9. The optoelectronic semiconductor device according to claim 6, further comprising
a first semiconductor layer of a first conductivity type, and
a second semiconductor layer of a second conductivity type, the active zone being arranged between the first and the second semiconductor layers.

10. The optoelectronic semiconductor device according to claim 6, which is a light-emitting diode.

11. The optoelectronic semiconductor device according to claim 6, which is a converter which is suitable for receiving electromagnetic radiation of a first wavelength and for emitting electromagnetic radiation of a second wavelength which is greater than the first wavelength.

12. The optoelectronic semiconductor device according to claim 6, wherein sidewalls of the optoelectronic semiconductor device intersect a horizontal direction.

13. A method for manufacturing an optoelectronic semiconductor device, comprising:
patterning a first main surface of a growth substrate, so that a first main surface comprises horizontal regions and inclined flanks;
epitaxially growing a semiconductor layer structure comprising sub-layers for forming an active zone comprising quantum well structures over the first main surface, so that the layer structure has a smaller layer thickness in the region of the inclined flanks than in the horizontal regions, and
singulating individual optoelectronic semiconductor devices in the region of the inclined flanks so that the inclined flanks are arranged adjoining a boundary of the optoelectronic semiconductor device and so that the semiconductor layer structure which has been grown over the horizontal regions of the first main surface is present in a central area of the optoelectronic semiconductor device, and the semiconductor layer structure which has been grown over the inclined flanks is present in an edge region of the optoelectronic semiconductor device.

14. The method according to claim 13, wherein growing the semiconductor layer structure comprises growing a first semiconductor layer of a first conductivity type, the sub-layers for forming the active zone and a second semiconductor layer of a second conductivity type.

15. The method according to claim 13, in which the layers for forming the active zone are formed in an inclined manner in the region of the inclined flanks.

16. The method according to claim 13, in which the quantum well structures in the area of the inclined flanks have greater energy differences in energy levels than the quantum well structures in the horizontal regions.

17. The method according to claim 13, further comprising removing or thinning the growth substrate.

\* \* \* \* \*